US010716262B2

(12) United States Patent
Wu et al.

(10) Patent No.: US 10,716,262 B2
(45) Date of Patent: *Jul. 21, 2020

(54) LED FOR PLANT ILLUMINATION

(71) Applicant: XIAMEN SANAN OPTOELECTRONICS TECHNOLOGY CO., LTD., Xiamen (CN)

(72) Inventors: Chaoyu Wu, Xiamen (CN); Chun-I Wu, Xiamen (CN); Junkai Huang, Xiamen (CN); Duxiang Wang, Xiamen (CN); Hongliang Lin, Xiamen (CN); Yi-Jui Huang, Xiamen (CN); Ching-Shan Tao, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/194,287

(22) Filed: Nov. 16, 2018

(65) Prior Publication Data

US 2019/0082614 A1    Mar. 21, 2019

Related U.S. Application Data

(63) Continuation of application No. 15/594,617, filed on May 14, 2017, now Pat. No. 10,154,626, which is a
(Continued)

(30) Foreign Application Priority Data

Mar. 7, 2013  (CN) .......................... 2013 1 0072627
Aug. 30, 2016 (CN) .......................... 2016 1 0757136

(51) Int. Cl.
*A01G 7/04* (2006.01)
*H01L 33/06* (2010.01)
(Continued)

(52) U.S. Cl.
CPC .............. *A01G 7/045* (2013.01); *H01L 33/06* (2013.01); *H01L 33/08* (2013.01); *H01L 33/10* (2013.01); *Y02P 60/149* (2015.11)

(58) Field of Classification Search
CPC ......... H01L 33/08; H01L 33/06; H01L 33/10; Y02P 60/149; A01G 7/045
See application file for complete search history.

(56) References Cited

U.S. PATENT DOCUMENTS 10,154,626 B2 *  12/2018  Lin ........................ H01L 33/06
2011/0291129 A1 *  12/2011  Wirth ..................... H05B 45/20
                                                              257/89
(Continued)

FOREIGN PATENT DOCUMENTS

JP        2004-014965 A      1/2004

*Primary Examiner* — Victor A Mandala
(74) *Attorney, Agent, or Firm* — Syncoda LLC; Feng Ma

(57) ABSTRACT

An epitaxial wafer for plant lighting light-emitting diodes (LED), the epitaxial wafer includes: a growth substrate; a first red-light epitaxial laminated layer; a distributed Bragg reflector (DBR) semiconductor laminated layer; and a second red-light epitaxial laminated layer; wherein: the first red-light epitaxial laminated layer comprises a first N-type ohmic contact layer, a first N-type covering layer, a first light-emitting layer, a first P-type covering layer, and a first P-type ohmic contact layer; and the second red-light epitaxial laminated layer comprises a second N-type ohmic contact layer, a second N-type covering layer, a second light-emitting layer, a second P-type covering layer, and a second P-type ohmic contact layer.

20 Claims, 13 Drawing Sheets

Related U.S. Application Data continuation-in-part of application No. 14/415,037, filed as application No. PCT/CN2013/075684 on May 16, 2013, now abandoned.

(51) Int. Cl.
*H01L 33/08* (2010.01)
*H01L 33/10* (2010.01)

(56) References Cited

U.S. PATENT DOCUMENTS

| | | | |
|---|---|---|---|
| 2011/0309755 A1* | 12/2011 | Wirth | H05B 45/20 |
| | | | 315/151 |
| 2015/0188087 A1* | 7/2015 | Lee | H01L 51/5265 |
| | | | 257/40 |
| 2017/0162758 A1* | 6/2017 | Weiler | C09K 11/0883 |
| 2017/0236875 A1* | 8/2017 | Kim | H01L 27/3213 |
| | | | 257/40 |

* cited by examiner

LED FOR PLANT ILLUMINATION

CROSS-REFERENCE TO RELATED APPLICATIONS

The present application is a continuation of, and claims priority to, U.S. patent application Ser. No. 15/594,617 filed on May 14, 2017, which claims priority to Chinese Patent Application No. 201610757136.6 filed on Aug. 30, 2016, and is a continuation-in-part of and claims priority to U.S. patent application Ser. No. 14/415,037 filed on Jan. 15, 2015, which in turn is a national stage application of, and claims priority to, PCT/CN2013/075684 filed on May 16, 2013, which claims priority to Chinese Patent Application No. 201310072627.3 filed on Mar. 7, 2013. The disclosures of these applications are hereby incorporated by reference in their entirety.

BACKGROUND

In recent years, many studies have been made on plant cultivation via artificial light source. In particular, the plant cultivation by the light-emitting diode (LED) attracts much attention due to excellent monochromaticity, energy saving, long service life and small size.

Plant illumination mainly includes the plant growth light and aquarium light. The plant growth light supplements the light source when the natural light is insufficient, which complements the sunlight and adjusts the agricultural product growth. The aquarium light not only improves the growth of aquatic plants, but also has the lighting effect for sightseeing.

Compared with traditional plant illumination, the LED plant illumination is advantageous in the following aspects: i) energy saving. The LED plant illumination may directly generate the light for plant with same-lumen photon, which consumes little power; ii) high efficiency. As monochromatic light, the LED can generate light waves matching the plant requirement, which cannot be achieved by traditional plant light; iii) the LED plant illumination has rich wavelength types capable of controlling the plant flowering, fruiting, plant height and nutrient contents. With the further improvement of LED plant illumination technology, it will be used for multi-layer 3D combined cultivation systems with less system heat, small space and low thermal load.

SUMMARY

The present disclosure describes an LED for plant illumination, including a new light-emitting material $Ga_XIn_{(1-X)}As_YP_{(1-Y)}$ of which can significantly improve the light-emitting efficiency by 50%-100%.

An LED for plant illumination, comprising a substrate arranged at the PN junction light-emitting part of the substrate. The light-emitting part has a strained light-emitting layer with component formula of $Ga_XIn_{(1-X)}As_YP_{(1-Y)}$ (0<X<1 and 0<Y<1).

In some embodiments, the light-emitting part has a strained light-emitting layer with component formula of $Ga_XIn_{(1-X)}As_YP_{(1-Y)}$ (0<X<1 and 0<Y<0.2).

In some embodiments, the light-emitting part has a strained light-emitting layer with component formula of $Ga_XIn_{(1-X)}As_YP_{(1-Y)}$ (0<X<1 and 0<Y<0.1).

In some embodiments, the light-emitting part has a strained light-emitting layer with component formula of $Ga_XIn_{(1-X)}As_YP_{(1-Y)}$ (0<X<1 and 0<Y<0.05).

In some embodiments, the light-emitting part has a barrier layer, forming a 2~40-pair alternating-layer structure with the strained light-emitting layer.

In some embodiments, each alternating-layer structure is 5-100 nm thick.

In some embodiments, the barrier layer has a component formula of $(Al_AGa_{1-A})_BIn_{(1-B)}P$ (0.3≤A≤1 and 0<B<1).

In some embodiments, the substrate material may be GaAs, GaP or any one of their combinations.

In some embodiments, the invention also comprises a buffer layer between the substrate and the light-emitting part.

In some embodiments, the invention also comprises a window layer arranged on the light-emitting part.

In some embodiments, the window layer material is GaP.

In some embodiments, the window layer is 0.5-15 μm thick.

In some embodiments, in the LED for improving photosynthesis during plant cultivation, the peak light-emitting wavelength of the strained light-emitting layer is 650 nm-750 nm.

In some embodiments, in the LED for improving photosynthesis during plant cultivation, the peak light-emitting wavelength of the strained light-emitting layer is 700 nm-750 nm.

In another aspect, an LED is provided for plant illumination, including a light-emitting part of strained light-emitting layer on the substrate with component formula of $Ga_XIn_{(1-X)}As_YP_{(1-Y)}$ (0<X<1 and 0<Y<1). The strained light-emitting layer material is GaInAsP, which can improve the light-emitting efficiency of the strained light-emitting layer. In addition, the material is helpful for improving life stability due to the lack of Al component.

In addition, by adjusting the composition and thickness of the strained light-emitting layer, the light-emitting wavelength from the strained light-emitting layer is in a range of 650 nm-750 nm. In some embodiments, a window layer is provided at the light-emitting part of the LED for plant illumination, which is transparent to the light-emitting wavelength, and therefore will not absorb the light from the light-emitting part. In addition, it can have a current spreading function.

Hence, according to some embodiments of this disclosure, a high output power and/or highly efficient LED capable of generating a large quantity of light-emitting wavelength of 650 nm-750 nm is provided.

In another aspect, an epitaxial wafer for a plant lighting LED is provided, including from up to bottom: a growth substrate, a first red-light epitaxial laminated layer, a distributed Bragg reflector (DBR) semiconductor laminated layer and a second red-light epitaxial laminated layer, wherein, the first red-light epitaxial laminated layer comprises a first N-type ohmic contact layer, a first N-type covering layer, a first light-emitting layer, a first P-type covering layer and a first P-type ohmic contact layer; and the second red-light epitaxial laminated layer comprises a second N-type ohmic contact layer, a second N-type covering layer, a second light-emitting layer, a second P-type covering layer and a second P-type ohmic contact layer.

In some embodiments, a doping concentration of the DBR semiconductor laminated layer is ≤5×10$^{17}$, to form a high resistance interface.

In some embodiments, light emitting wavelength of the first light-emitting layer is 710 nm~750 nm, and that of the second light-emitting layer is 640 nm~680 nm.

In some embodiments, light emitting wavelength of the first light-emitting layer is 730 nm, and that of the second light-emitting layer is 660 nm.

In some embodiments, an etching stop layer is provided between the DBR semiconductor laminated layer and the second red-light epitaxial laminated layer.

In another aspect, an LED chip for a plant lighting LED is provided, including from up to bottom: a first red-light epitaxial laminated layer, a DBR semiconductor laminated layer, a second red-light epitaxial laminated layer and a conductive bonding substrate; in which, the first red-light epitaxial laminated layer comprises a first N-type ohmic contact layer, a first N-type covering layer, a first light-emitting layer, a first P-type covering layer and a first P-type ohmic contact layer; and the second red-light epitaxial laminated layer comprises a second N-type ohmic contact layer, a second N-type covering layer, a second light-emitting layer, a second P-type covering layer and a second P-type ohmic contact layer; wherein, light-emitting area of the first red-light epitaxial laminated layer is less than that of the second red-light epitaxial laminated layer; the first N-type ohmic contact layer is provided with a first electrode; between the first P-type ohmic contact layer and the second N-type ohmic contact layer is provided with an electronic-connected structure, and the second P-type ohmic contact layer is provided with a second electrode.

In some embodiments, light emitting wavelength of the first light-emitting layer is 710 nm~750 nm, and that of the second light-emitting layer is 640~680 nm.

In some embodiments, doping concentration of the DBR semiconductor laminated layer is $\leq 5 \times 10^{17}$, to form a high resistance interface.

In some embodiments, surface of the second red-light epitaxial laminated layer is preset with a light-emitting zone and a non-light-emitting zone, and a DBR semiconductor laminated layer is formed on the non-light-emitting zone of the second red-light epitaxial laminated layer.

In some embodiments, area of the DBR semiconductor laminated layer is less than the light-emitting area of the second red-light epitaxial laminated layer, but larger than that of the first red-light epitaxial laminated layer.

In some embodiments, the non-light-emitting zone on the surface of the second N-type ohmic contact layer is provided with an electric diffusion structure.

In some embodiments, an etching stop layer is provided between the DBR semiconductor laminated layer and the second red-light epitaxial laminated layer.

In another aspect, a light-emitting system is provided for plant lighting. The system can include a plurality of the LED chips described above. The LED chips can form an array over a packaging frame.

In another aspect, a fabrication method for growing a plant lighting LED chip is provided, including: 1) epitaxial growth: provide a growth substrate, and form any of aforesaid LED epitaxial wafer for plant lighting; 2) substrate transfer: bond a conductive bonding substrate on the epitaxial wafer surface and remove the growth substrate to expose the first N-type ohmic contact layer surface of the epitaxial wafer; 3) defining of light-emitting zone: define a first light-emitting zone and a second light-emitting zone on the epitaxial wafer surface, and remove the first N-type ohmic contact layer, the first N-type covering layer, the first light-emitting layer and the first P-type covering layer of the second light-emitting zone to expose the first P-type ohmic contact layer; 4) electrode fabrication: remove the DBR semiconductor laminated layer of the second light-emitting zone and expose the surface of the second N-type ohmic contact layer; fabricate an N-type electrode on the surface of the first N-type ohmic contact layer, and fabricate an electronic-connected structure; electrically connect the first P-type ohmic contact layer and the second N-type ohmic contact layer.

In some embodiments, in step 3), the epitaxial wafer surface is also defined with an isolation zone between the first light-emitting zone and the second light-emitting zone.

In some embodiments, in step 3), remove the second light-emitting zone and the first N-type ohmic contact layer, the first N-type covering layer, the first light-emitting layer and the first P-type covering layer of the isolation zone.

In some embodiments, after step 4), the DBR layer is larger than the first light-emitting zone but smaller than the second light-emitting zone.

Other features and advantages of the present disclosure will be described in detail in the following specification, and moreover, will become obvious partially through the Specification or understood through implementations of the present disclosure.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

In the drawings.

200: growth substrate; 210: far red-light epitaxial laminated layer; 211: first N-type etching stop layer; 212: first N-type ohmic contact layer; 213: first N-type electrode diffusion layer; 214: first N-type covering layer; 215: first light-emitting layer; 216: first P-type covering layer; 217: first P-type ohmic contact layer; 220: DBR semiconductor laminated layer; 230: super red-light epitaxial laminated layer; 231: second N-type etching stop layer; 232: second N-type ohmic contact layer, 233: second N-type electrode diffusion layer; 234: second N-type covering layer; 235: second light-emitting layer; 236: second P-type covering layer; 237: P-type transition layer; 238: second P-type ohmic contact layer; 240: mirror structure; 250: conductive bonding layer; 260: conductive bonding substrate; 271: N-type electrode; 272: BeAu metal layer; 273: electronic-connected structure; 274: electrode extension bar; 275: P-type electrode.

DETAILED DESCRIPTION

Based on study results so far, the light-emitting wavelength of light sources suitable for plant growth is near 450 nm (blue light) and 600-750 nm (red light).

The traditional light-emitting layer for plant illumination is AlGaAsP or AlGaAs. However, the LED with light-emitting layer made of AlGaAsP or AlGaAs has low light-emitting output power. To promote feasible light source of LED for plant cultivation, it is necessary to develop LED with high output power and/or high efficiency in consideration of energy and cost saving.

The following embodiments provide a LED with 650-750 nm wavelength suitable for plant illumination, featured by high output power and stable service life.

The GaInP light-emitting wavelength is near 640 nm and the GaAs light-emitting wavelength is near 850 nm. In the following embodiments, the light-emitting layer GaInP material is doped with As and the thickness and strain capacity of the strained light-emitting layer are adjusted; therefore, an LED composed of new epitaxial structure for plant illumination is developed that is suitable for wavelength of 650-750 nm.

Detailed descriptions will be given below about this disclosure with reference to accompanying drawings and embodiments.

Embodiment 1

Figure 1:
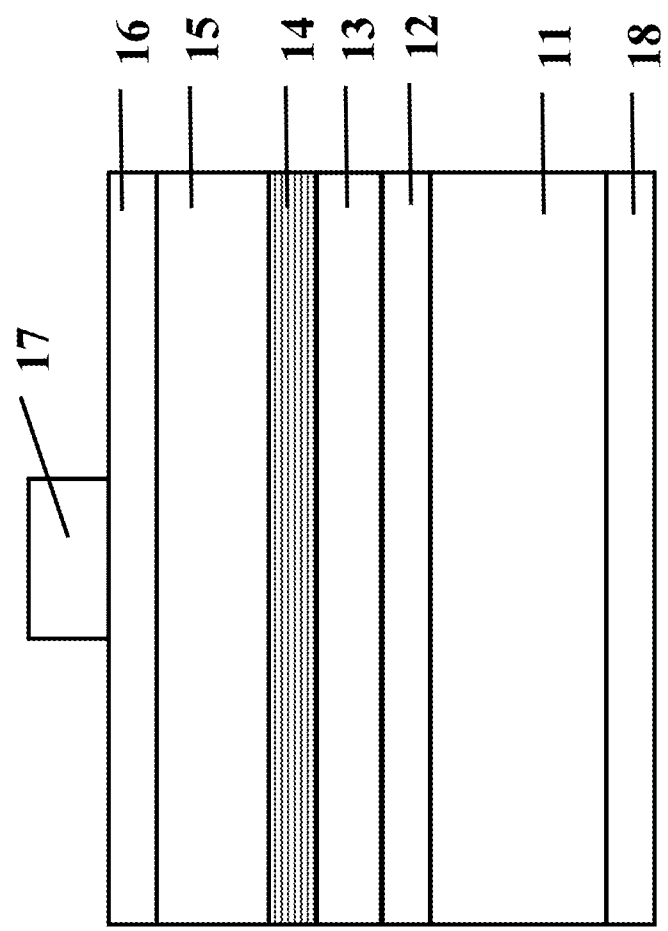
FIG. 1 is a sectional structure diagram of an LED for plant illumination according to some embodiments.

As shown in FIG. 1, an LED comprises: a substrate 11, divided into a first surface and a second surface; a light-emitting part, which consists of a stack of semiconductor material layers, including a buffer layer 12, a first restriction layer 13, a light-emitting layer 14 and a second restriction layer 15, sequentially from down up and formed on the first surface of the substrate 11; a window layer 16 formed on a partial region of the second restriction layer 15 of the light-emitting part; a second electrode 17, formed on the window layer 16; and a second electrode 18, formed on the second surface of the substrate 11.

In the element, the substrate 11 material may be GaAs, GaP or any one of their combinations.

The buffer layer 12 can mitigate lattice imperfection of the epitaxially growing substrate but is not a necessary film for the element.

The light-emitting part consists of an alternating layer (of strained light-emitting layer and barrier layer) structure, including at least two 2 pairs (preferably 2-40 pairs). The structure of each pair of alternating-layers is, without limitation to, 5-100 nm thick. A structure of a plurality of alternating layers can effectively improve the saturation current of the element. In this embodiment, the pair number of the alternating layer structure of alternating strained light-emitting layer and barrier layer is 6. The structure of each pair is 40 nm thick and the total thickness is 240 nm.

The strained light-emitting layer material is Al-free GaInAsP with component formula of $Ga_XIn_{(1-X)}As_YP_{(1-Y)}$ (0<X<1 and 0<Y<1). In some embodiments, to better control the peak wave of the light-emitting layer within 650 nm-750 nm, the Y value is preferably 0<Y<0.2. In this embodiment, X=0.5 and Y=0.01.

The barrier layer material is AlGaInP with component formula of $(Al_AGa_{1-A})_BIn_{(1-B)}P$ (0.3<A<1 and 0<B<1). In this embodiment, A=0.5 and B=0.5.

The window layer is GaP (thickness: 0.5 μm-15 μm) and is capable of current expansion. The window layer is not a necessary film for the element, which can be chosen based on the process parameters.

Referring to Table 1 for the optical-electrical characteristics of the 42×42 mil large-power quaternary LED element structure. As shown in Table 1, based on the flowing current results of the first electrode and second electrode after being powered on, the element emits red light with an average peak wavelength of 685.6 nm. When the 350 mA current flows through in forward direction, the average forward voltage value is 2.25 V and the output power is 250.3 mW.

TABLE 1

|  | VF/V | Po/mW | WLD/nm | WLP/nm |
|---|---|---|---|---|
| No. 1 | 2.26 | 248.5 | 656.2 | 686.0 |
| No. 2 | 2.23 | 252.1 | 656.2 | 685.1 |
| Average | 2.25 | 250.3 | 656.2 | 685.6 |

Embodiment 2

In comparison with Embodiment 1, t the following is the same: in the 42×42 mil quaternary LED element structure of this embodiment, the pair number of the alternating-layer (of strained light-emitting layer and barrier layer) structure is 6. The structure of each pair is 60 nm thick and the total thickness is 360 nm. The difference is that: the strained light-emitting layer is $Ga_XIn_{(1-X)}As_YP_{(1-Y)}$ (X=0.5 and Y=0.025). Based on the flowing current results of the first electrode and second electrode after being powered on, the element emits red light with average main wavelength of 680.2 nm and average peak wavelength of 714.9 nm. When the 350 mA current flows through in forward direction, the average forward voltage value is 2.22 V and the output power is 232.7 mW.

Embodiment 3

In comparison with Embodiment 1, the difference is that: the strained light-emitting layer of the 42×42 mil quaternary LED element structure of this embodiment is $Ga_XIn_{(1-X)}As_YP_{(1-Y)}$ (X=0.5 and Y=0.04).

Refer to Table 2 for the optical-electrical characteristics of the 42×42 mil quaternary LED element structure. As shown in Table 2, based on the flowing current results of the first electrode and second electrode after being powered on, the element emits red light with average peak wavelength of 722.0 nm. When the 350 mA current flows through in forward direction, the average forward voltage value is 2.18 V and the output power is 216.5 mW.

TABLE 2

|  | VF/V | Po/mW | WLD/nm | WLP/nm |
|---|---|---|---|---|
| No. 1 | 2.19 | 215.7 | 693.7 | 721.7 |
| No. 2 | 2.20 | 222.7 | 697.4 | 723.5 |
| No. 3 | 2.16 | 220.1 | 701.7 | 723.5 |
| No. 4 | 2.19 | 207.6 | 691.5 | 719.3 |
| Average | 2.19 | 216.5 | 696.1 | 722.0. |

Embodiment 4

In comparison with Embodiment 3, the difference is that: the strained light-emitting layer of the 42×42 mil quaternary LED element structure of this embodiment is $Ga_XIn_{(1-X)}As_YP_{(1-Y)}$ (X=0.5 and Y=0.05). Based on the flowing current results of the first electrode and second electrode after powering on, the element emits red light with average main wavelength of 712.3 nm and average peak wavelength of 739.5 nm. When the 350 mA current flows through in forward direction, the average forward voltage value is 2.21 V and the output power is 202.2 mW.

Embodiment 5

In comparison with Embodiment 3, the difference is that: in the 42×42 mil quaternary LED element structure of this embodiment, the pair number of alternating-layer (of strained light-emitting layer and barrier layer) structure is 9. The structure of each pair is 50 nm thick and the total thickness is 450 nm. Based on the flowing current results of the first electrode and second electrode after powering on, the element emits red light with average main wavelength of 701.5 nm and average peak wavelength of 733.5 nm. The saturation current is above 2,000 mA. When the 350 mA current flows through in forward direction, the average forward voltage value is 2.24 V and the output power is 223.9 mW.

emitting portion (MQW structure) remain unchanged, if Y is 0.01, light emitting efficiency is highest.

With As added in the light emitting layer, lattice constant of the strain light-emitting layer in the light-emitting zone is larger than that of GaAs, thus generating compression strain. Therefore, to reduce such compression strain, a barrier layer $(Al_AGa_{1-A})_BIn_{(1-B)}P$ is designed, wherein, 0.5<B≤0.52, i.e., lattice constant of the barrier layer is less than that of the GaAs base, thus generating tension strain. With a combination of the light-emitting zone and the barrier layer, effect and substrate mismatch degree get smaller to improve light-emitting efficiency and reliability of the material. As shown in Table 3, when B is 0.52, the light-emitting efficiency is highest.

For a MQW structure, total tension strain=compression strain of strain light-emitting layer (quantum well)*well thickness (positive)+tension strain of barrier layer (quantum barrier)*barrier thickness (negative). Total tension strain is preferred to be less than 500 ppm and preferably 100~200 ppm as evidenced by an experiment. To achieve highlighting efficiency LED with 650~750 nm light-emitting wavelength, as shown in optimized experiment results, when B=0.52 in the barrier layer $(Al_AGa_{1-A})_BIn_{(1-B)}P$ and Y=0.01 in the light-emitting layer $Ga_XIn_{(1-X)}As_XP_{(1-Y)}$, and total thickness is 360 nm, light-emitting effect of LED is best, reaching 1.5-2 times compared with conventional method.

TABLE 3

| No. | 1 | 2 | 3 | 4 | 5 | 6 | 7 | 8 |
|---|---|---|---|---|---|---|---|---|
| Y value [Light emitting layer $Ga_XIn_{(1-X)}As_YP_{(1-Y)}$] | 0 | 0.01 | 0.025 | 0.01 | 0.01 | 0.01 | 0.01 | 0.01 |
| b value [Barrier layer $(Al_AGa_{1-A})_BIn_{(1-B)}P$] | 0.5 | 0.5 | 0.5 | 0.5 | 0.52 | 0.53 | 0.52 | 0.52 |
| Total thickness of MQW/nm | 240 | 240 | 240 | 240 | 240 | 240 | 360 | 450 |
| (Po/VF/350 mA) Light-emitting efficiency (Po/VF/350 mA) | 13.70% | 28.80% | 27.90% | 28.40% | 29.10% | 28.30% | 30.50% | 27% |

To sum up, in the LED element structure for improving photosynthesis during plant cultivation, the peak light-emitting wavelength can be controlled within 650-750 nm by adjusting the composition of strained light-emitting layer, component value range and the pair number and thickness range of the alternating-layer (of strained light-emitting layer and barrier layer) structure, thereby achieving high output power. In addition, the material is helpful for improving life stability due to the lack of Al component.

Embodiment 6

The larger is Y value in the strain light-emitting layer $Ga_XIn_{(1-X)}As_YP_{(1-Y)}$, the narrower is the material gap, and the longer is the light emitting wavelength. Moreover, mismatch degree between the light emitting portion and base gets larger, and lattice growth quality of material gets poorer. As evidenced by experiment, as Y changes from 0 to 0.1, mismatch degree of the light emitting portion material increases gradually and lattice growth quality gets poorer. As the comparison examples No. 1~No. 8 in Table 3 shown, when b value of the barrier layer $(Al_AGa_{1-A})_BIn_{(1-B)}P$ and total thickness of the alternating laminated structure in light

Embodiment 7

It is common to pack the deep-blue-light, ultra-red-light and far-red-light LED chip with single wavelength one by one, and assemble individual packages on the light plate in various arrangements, as shown in FIG. 14. Due to limited space and cost, it is better to use less LEDs in smaller size.

This embodiment discloses a LED for plant lighting, in which, ultra-red light (~660 nm) and far-red light (~730 nm) for plant lighting are realized in a single chip via laminated layer epitaxy.

Figure 2:
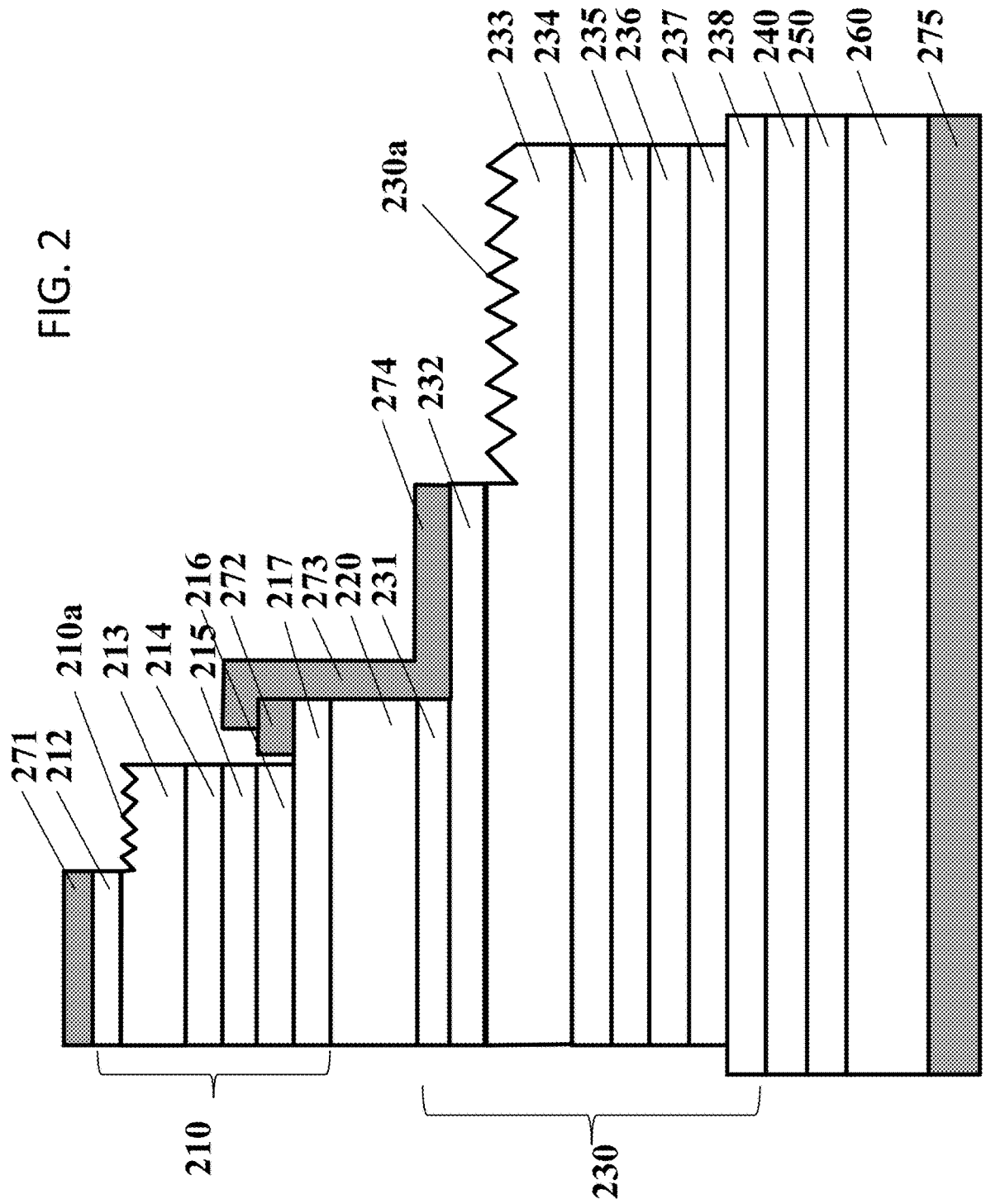
FIG. 2 is a side sectional view of a LED chip for plant lighting in accordance with Embodiment 7.

With reference to FIG. 2, a vertical LED chip according to the present invention is provided, comprising: a far-red-light epitaxial laminated layer 210, a distributed Bragg reflector (DBR) semiconductor laminated layer 220, a ultra-red-light epitaxial laminated layer 230, a mirror structure 240, a conductive bonding layer 250, a conductive substrate 260, an N-type electrode 271 and a P-type electrode 275, Wherein, light-emitting wavelength of the far-red-light epitaxial laminated layer 210 is 710 nm~750 nm, preferably, ~730 nm, and that of the far-red-light epitaxial laminated layer 210 is 640 nm~680 nm, preferably, ~660 nm. In some embodiments, lighting area 210a of the far-red-light epitaxial laminated layer 210 is less than or equals to lighting area 230a of the ultra-red-light epitaxial laminated layer 230. Preferably, lighting area 210a of the far-red-light epitaxial laminated layer 210 is one-third of lighting area 230a of the ultra-red-light epitaxial laminated layer 230.

The DBR semiconductor laminated layer 220 is located between the far-red-light epitaxial laminated layer 210 and the ultra-red-light epitaxial laminated layer 230. On the one hand, it reflects far red light emitted by the far-red-light epitaxial laminated layer 210 and prevents such light from being absorbed by the ultra-red-light epitaxial laminated layer 230; on the other hand, a high-resistance interface is formed as a current blocking layer to make current flow to the light-emitting zone of the ultra-red-light epitaxial laminated layer 230, which has no far-red-light epitaxial laminated layer 210, so as to improve luminance. Therefore, doping concentration of the DBR semiconductor laminated layer 220 is preferred to be not more than $5 \times 10^{17}$, and preferably $4.00 \times 10^{17}$.

The far-red-light epitaxial laminated layer 210 and the ultra-red-light epitaxial laminated layer 230 can be made of AlGaInP-based material, wherein, the far-red-light epitaxial laminated layer 210, from up to bottom, comprises an N-type ohmic contact layer 212, a first N-type electrode diffusion layer 213, a first N-type covering layer 214, a first light emitting layer 215, a first P-type covering layer 216 and a first P-type ohmic contact layer 217; and the ultra-red-light epitaxial laminated layer 230, from up to bottom. comprises a second N-type ohmic contact layer 232, a second N-type electrode diffusion layer 233, a second N-type covering layer 234, a second light emitting layer 235, a second P-type covering layer 236, a P-type transition layer 237 and a second P-type ohmic contact layer 238. An N-type etching stop layer 231 can be provided between the ultra-red-light epitaxial laminated layer 230 and the DBR semiconductor laminated layer 220.

Figure 3:
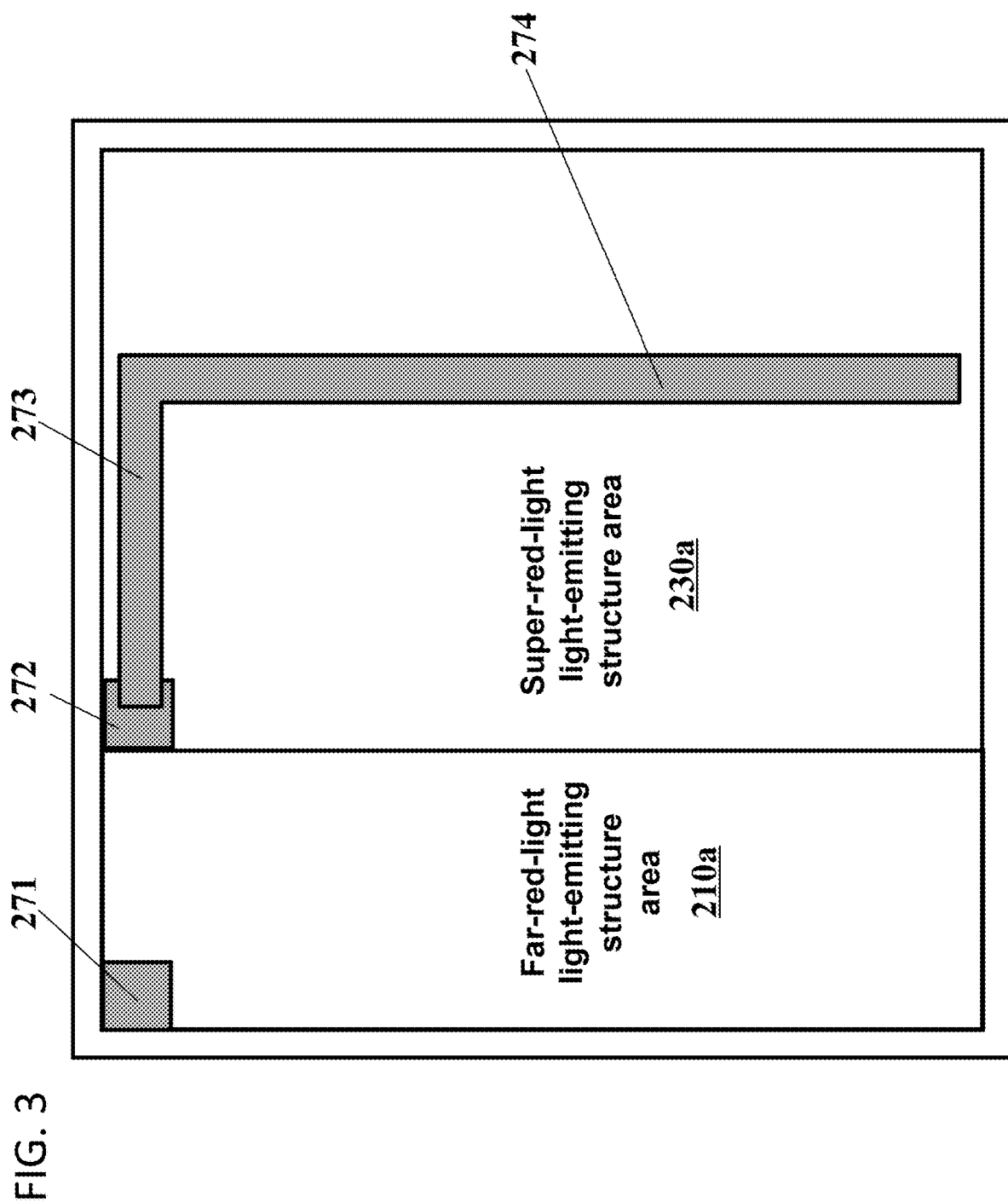
FIG. 3 is a top view of the LED chip as shown in FIG. 2.

A step-shaped structure is provided between the far-red-light epitaxial laminated layer 210 and the ultra-red-light epitaxial laminated layer 230 for fabricating an electronic-connected structure 271, wherein, one end is connected to the ohmic contact layer 261 of the far-red-light epitaxial laminated layer 210, and the other end is connected to the ohmic contact layer 237 of the ultra-red-light epitaxial laminated layer 230. Preferably, as lighting area 230a of the ultra-red-light epitaxial laminated layer 230 is larger than lighting area 210a of the far-red-light epitaxial laminated layer 210, an extension bar 274 can be set on the ohmic contact layer 237 of the ultra-red-light epitaxial laminated layer 230 to ensure even light-emitting of the light emitting layer, as shown in FIG. 3.

With reference to FIGS. 4-13 and fabrication method, the structure of the LED chip is described in detail below, mainly comprising: (I) epitaxial growth; (II) substrate transfer; (III) defining of light-emitting zone; (IV) electrode fabrication.

(I) Epitaxial Growth

Figure 4:
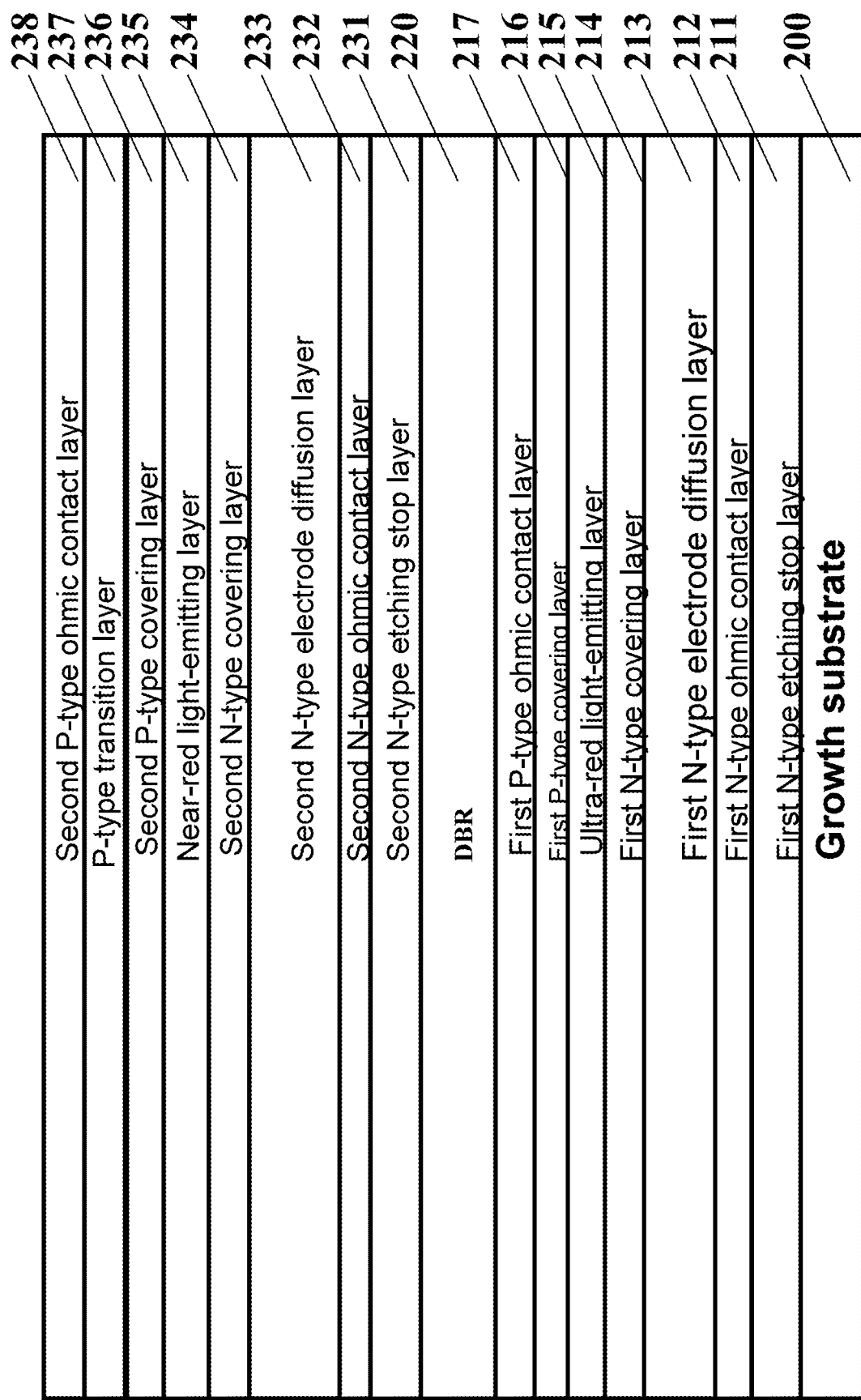
FIG. 4 illustrates a first step of fabricating an LED chip for plant lighting according to some embodiments.

Form an epitaxial structure on the growth substrate, as shown in FIG. 4. The key of the structure is to grow an epitaxial layer as shown in Table 4 on the GaAs substrate in sequence. It should be noted that only one typical material is listed in the table below for material of each layer of the epitaxial structure. The material in actual application is not limited to the listed one but can be expended to any other necessary materials.

TABLE 4

| Function | Layer | Material | Thickness (nm) | Doping concentration |
|---|---|---|---|---|
| P-type ohmic contact layer (2) | P-GaP | GaP:Mg | ≥500 | ≥$8.00 \times 10^{17}$ |
| P-type transition layer | P-AlGaInP | AlGaInP:Mg | ≤100 | ≥$2.00 \times 10^{18}$ |
| P-type covering layer (2) | P-AlInP (2) | AlInP:Mg | ≥500 | ≥$1.20 \times 10^{18}$ |
| ~660 nm light emitting layer | GaInP-well AlGaInP-barrier | GaInP AlGaInP | ≥8 × 3 ≥8 × 3 | — — |
| N-type covering layer (2) | N-AlInP (2) | AlInP:Si | ≥500 | ≥$1.60 \times 10^{18}$ |
| N-type current diffusion layer (2) | N-AlGaInP (2) | AlGaInP:Si | ≥1000 | ≥$1.00 \times 10^{17}$ |
| N-type ohmic contact layer (2) | N-GaAs (2) | GaAs:Si | ≥100 | ≥$6.00 \times 10^{18}$ |
| N-type etching stop layer (2) | N-GaInP (2) | GaInP:Si | ≥100 | ≥$1.00 \times 10^{18}$ |
| DBR semiconductor laminated layer | P-AlAs P-AlGaAs | AlAs:Mg AlGaAs:Mg | ≥54.5 × 2 ≥50.9 nm × 2 | ≤$5.00 \times 10^{17}$ ≤$5.00 \times 10^{17}$ |
| P-type ohmic contact layer (1) | P-GaAs | GaAs:Mg | ≥500 | ≥$1.00 \times 10^{18}$ |
| P-type covering layer (1) | P-AlInP (1) | AlInP:Mg | ≥900 | ≥$1.20 \times 10^{18}$ |
| ~730 nm light emitting layer (1) | AlGaAs-well AlGaInP-barrier | AlGaAs AlGaInP | ≥12 × 3 ≥13 × 3 | — — |
| N-type covering layer (1) | N-AlInP (1) | AlInP:Si | ≥500 | ≥$1.60 \times 10^{18}$ |
| N-type current diffusion layer (1) | N-AlGaInP (1) | AlGaInP:Si | ≥1000 | ≥$1.00 \times 10^{17}$ |
| N-type ohmic contact layer (1) | N-GaAs (1) | GaAs:Si | ≥100 | ≥$6.00 \times 10^{18}$ |
| N-type etching stop layer (1) | N-GaInP (1) | GaInP:Si | ≥100 | ≥$1.00 \times 10^{18}$ |

GaAs substrate (II) Substrate Transfer

In this step, bond the conductive substrate 260 and remove the growth substrate. To reach sufficient light emitting efficiency, a mirror structure is designed between the conductive substrate 260 and the epitaxial structure. In the embodiments below, at first, fabricate a mirror structure before substrate transfer. Details are as follows.

At first, on the surface of the second P-type ohmic contact layer 238 of the epitaxial structure, plate a light-transmission dielectric layer, and make a hole on the dielectric layer to remove the plated P-type metal ohmic contact layer (such as AuZn) and metal mirror layer (such as Au) to form a mirror structure 240. According to a variant, deposit a transparent conducing layer (such as ITO) and a metal mirror layer (such as Ag) on the surface of the second P-type ohmic contact layer 238 in sequence to form another mirror structure.

Figure 5:
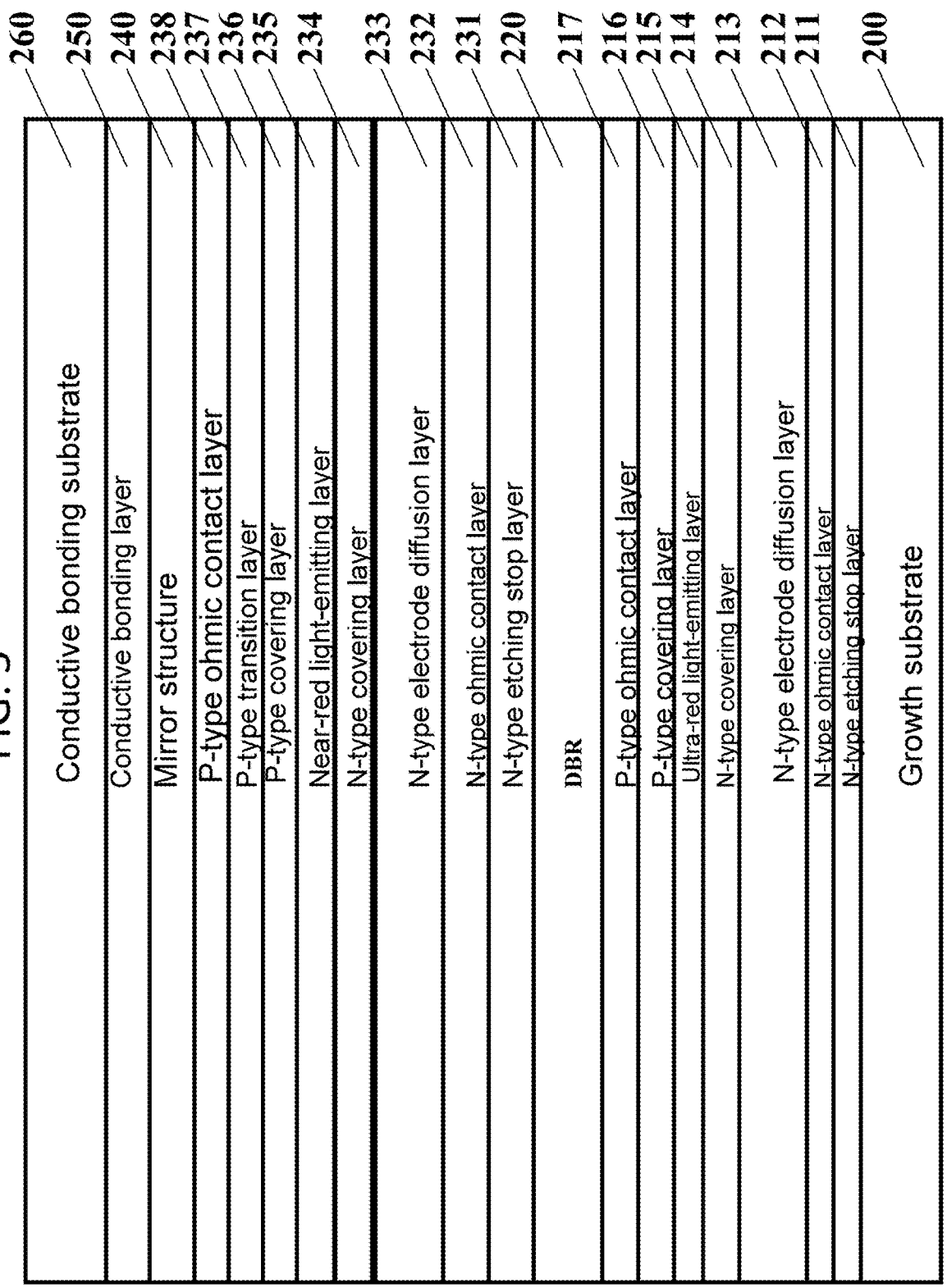
FIG. 5 illustrates a second step of fabricating an LED chip for plant lighting according to some embodiments.

Next, plate a bonding layer 250 on the mirror structure 240, and perform bonding for the conductive substrate 260 with a bonding layer to complete metal bonding. The structure is shown in FIG. 5. The metal bonding layer 250 can be made of Au/Au, Au/In, Au/Sn, Ni/Sn.

Figure 6:
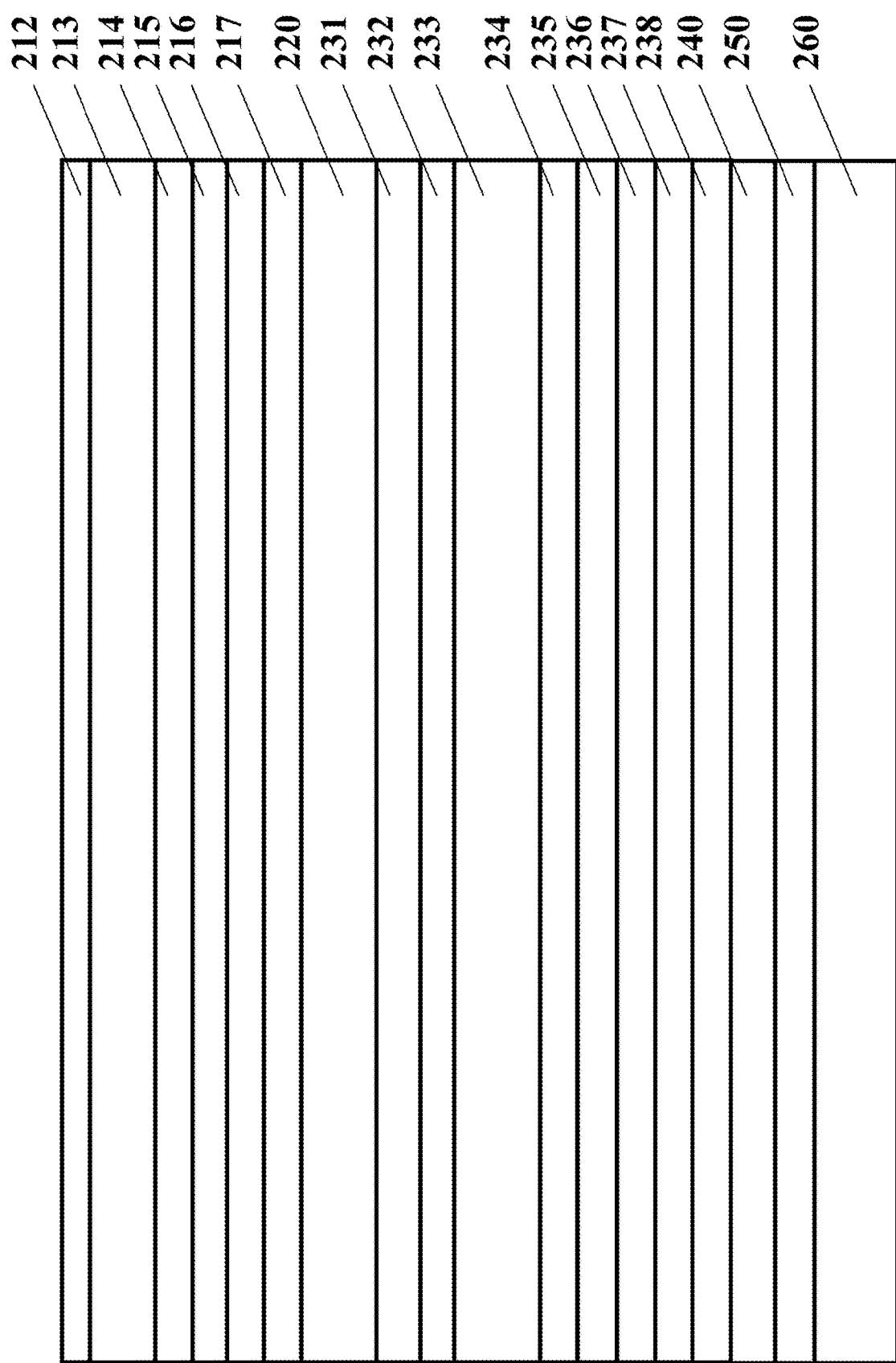
FIG. 6 illustrates a third step of fabricating an LED chip for plant lighting according to some embodiments.

Remove GaAs substrate with alkaline solution and the first N-type etching stop layer 211 with hydrochloride acid solution, and expose the first N-type ohmic contact layer 212 to complete substrate transfer, as shown in FIG. 6.

(III) Defining of Light-Emitting Zone

Figure 7:
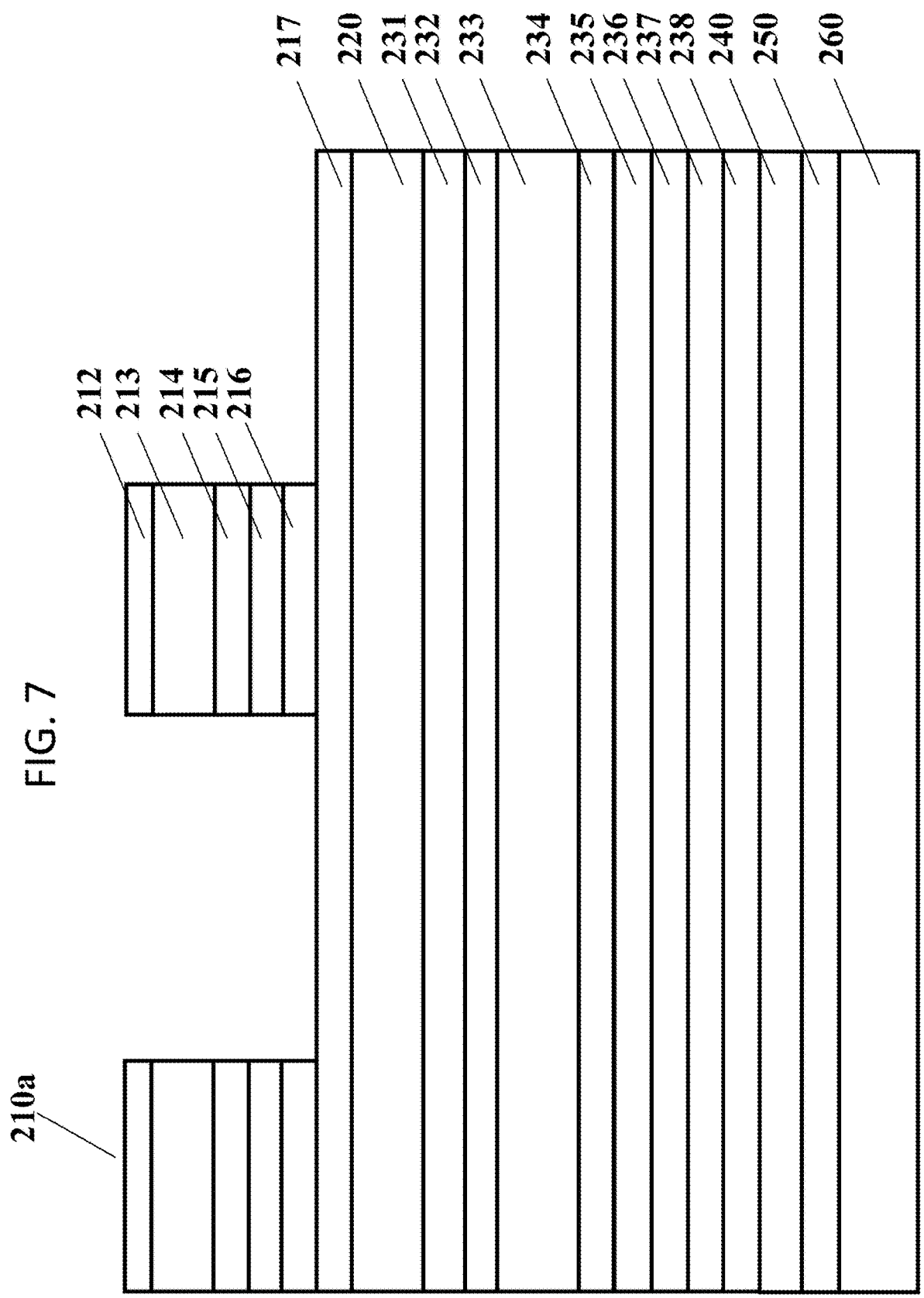
FIG. 7 illustrates a fourth step of fabricating an LED chip for plant lighting according to some embodiments.

Preset a far-red-light light-emitting zone 210a on surface of the first N-type ohmic contact layer 212 of the epitaxial structure, and remove the first N-type ohmic contact layer 212, the first N-type current diffusion layer 213, the first N-type covering layer 214, the first light emitting layer 215, the first P-type covering layer 216 of the far-red-light light-emitting zone 210 to expose the first P-type ohmic contact layer 217, as shown in FIG. 7. The far-red-light light-emitting zone 210a can be referred to FIG. 3.

(IV) Electrode Fabrication

Figure 8:
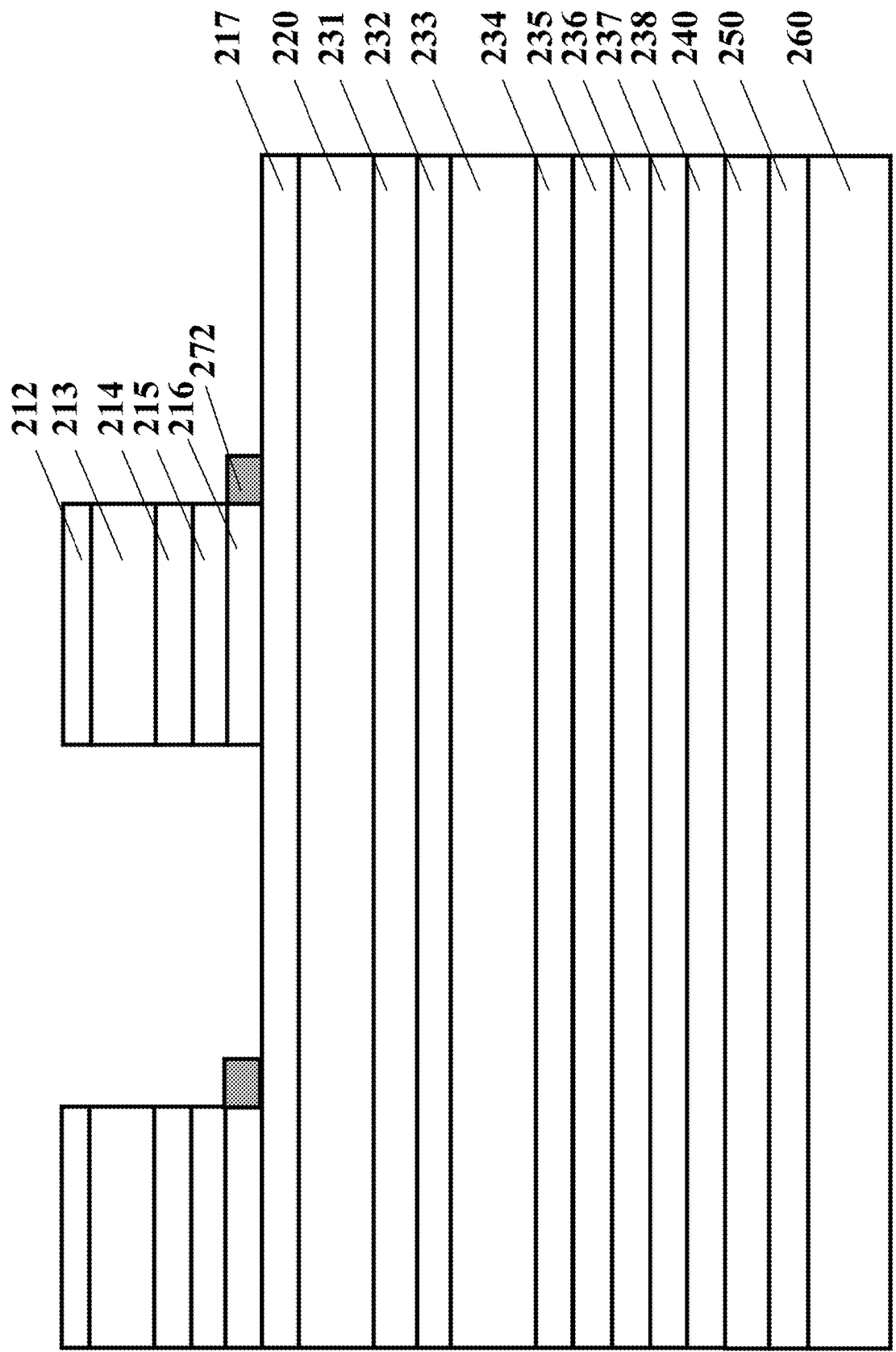
FIG. 8 illustrates a fifth step of fabricating an LED chip for plant lighting according to some embodiments.

At first, fabricate a BeAu metal layer 272 on surface of the first P-type ohmic contact layer 217, and form ohmic contact with the first P-type ohmic contact layer 217 after annealing, as shown in FIG. 8.

Figure 9:
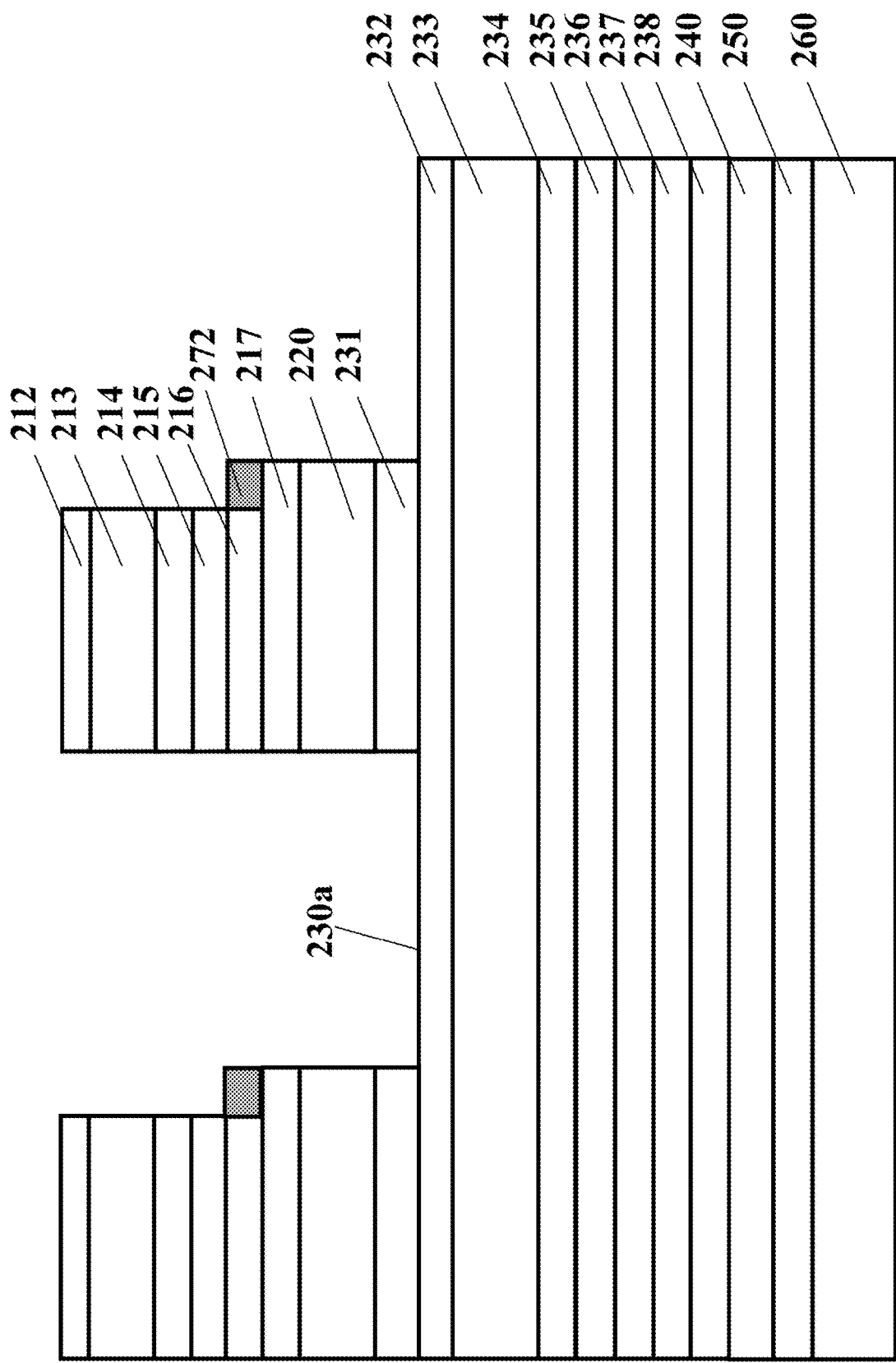
FIG. 9 illustrates a sixth step of fabricating an LED chip for plant lighting according to some embodiments.

Next, preset an ultra-red-light light-emitting zone 230a on surface of the first P-type ohmic contact layer 217 and remove the first P-type ohmic contact layer 217, the DBR semiconductor laminated layer 220 and the second N-type etching stop layer 231 of ultra-red-light light-emitting zone 230a to expose the second N-type ohmic contact layer 232, as shown in FIG. 9. Remove the first P-type ohmic contact layer 217 and the DBR semiconductor laminated layer 220 with phosphoric acid solution, and remove the second N-type etching stop layer 231 with hydrochloride acid solution.

Figure 10:
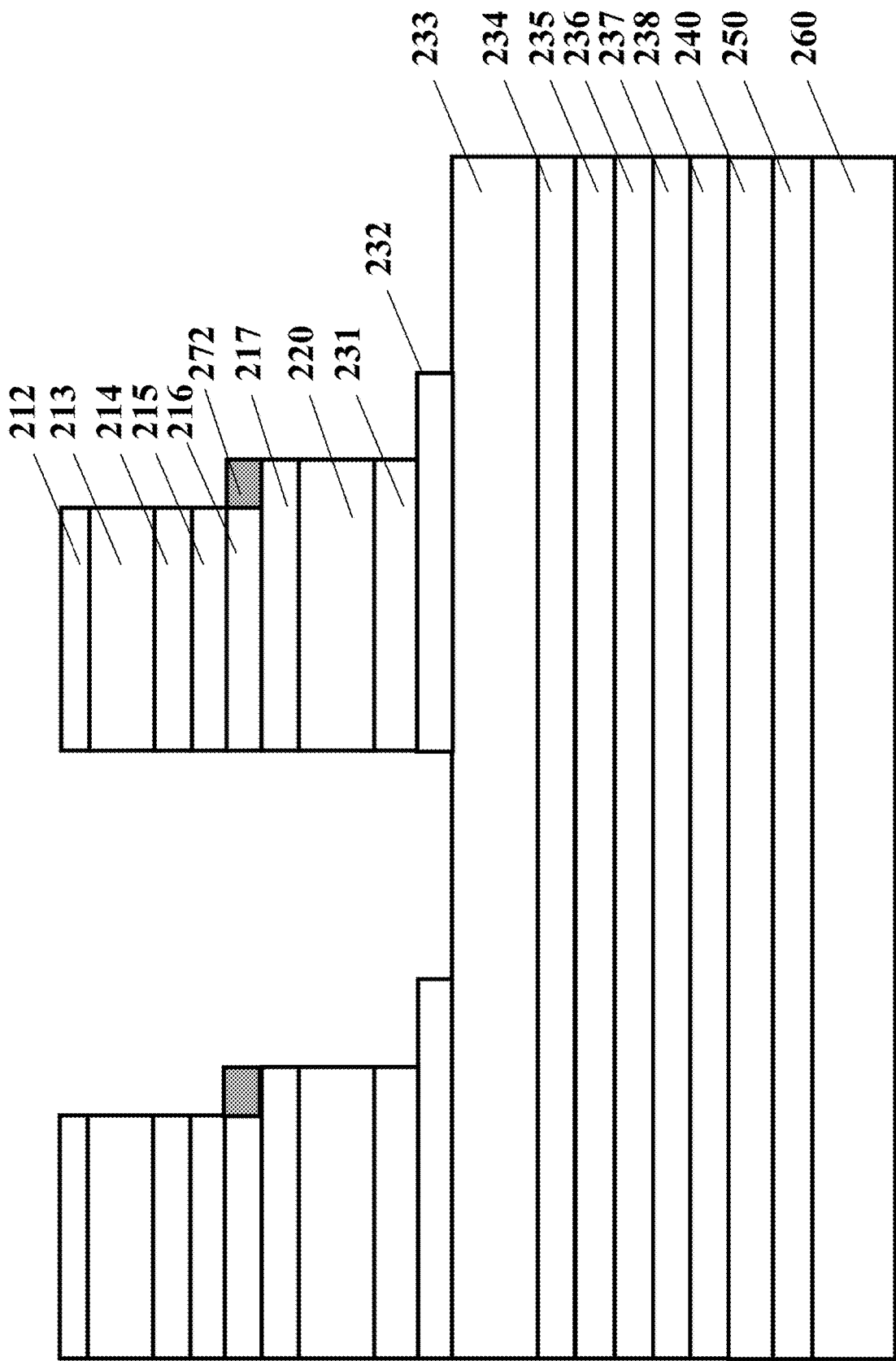
FIG. 10 illustrates a seventh step of fabricating an LED chip for plant lighting according to some embodiments.

Remove the second N-type ohmic contact layer 232 with LIT Litho or phosphoric acid solution and leave the ohmic contact zone for patterning, as shown in FIG. 10. The remaining portion can be referred to corresponding areas of the electronic-connected structure 273 and the electrode extension bar 274 as shown in FIG. 3.

Figure 11:
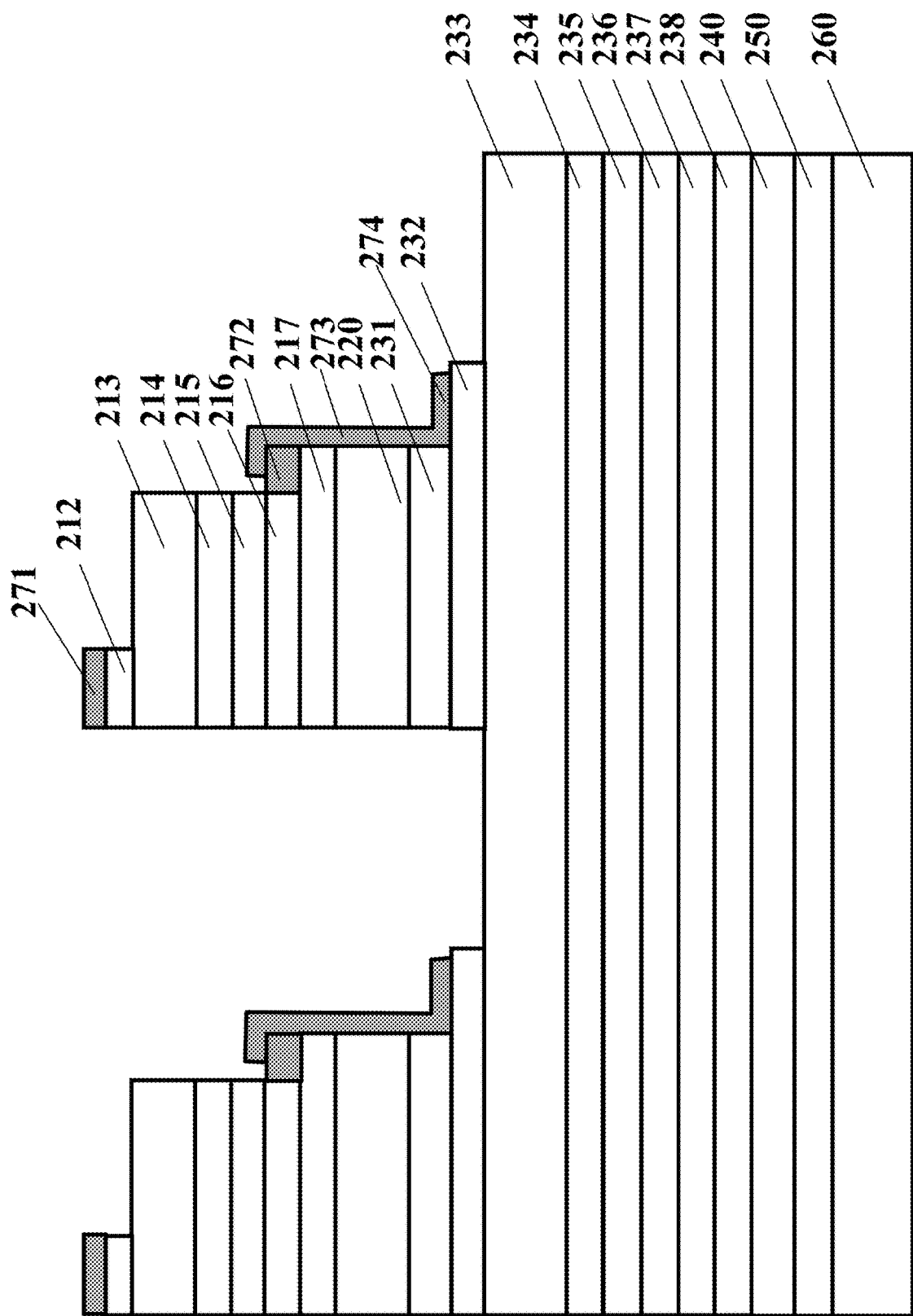
FIG. 11 illustrates an eight step of fabricating an LED chip for plant lighting according to some embodiments.

Next, evaporate GeAu on the first N-type ohmic contact layer 212 as the N-type electrode 271, and form GeAu metal on the second N-type ohmic contact layer 232, and connect it to the BeAu metal layer 272 on surface of the first P-type ohmic contact layer 217 as an electronic-connected structure 273 and an electrode extension bar 274. Form ohmic contact after annealing, as shown in FIG. 11.

Figure 12:
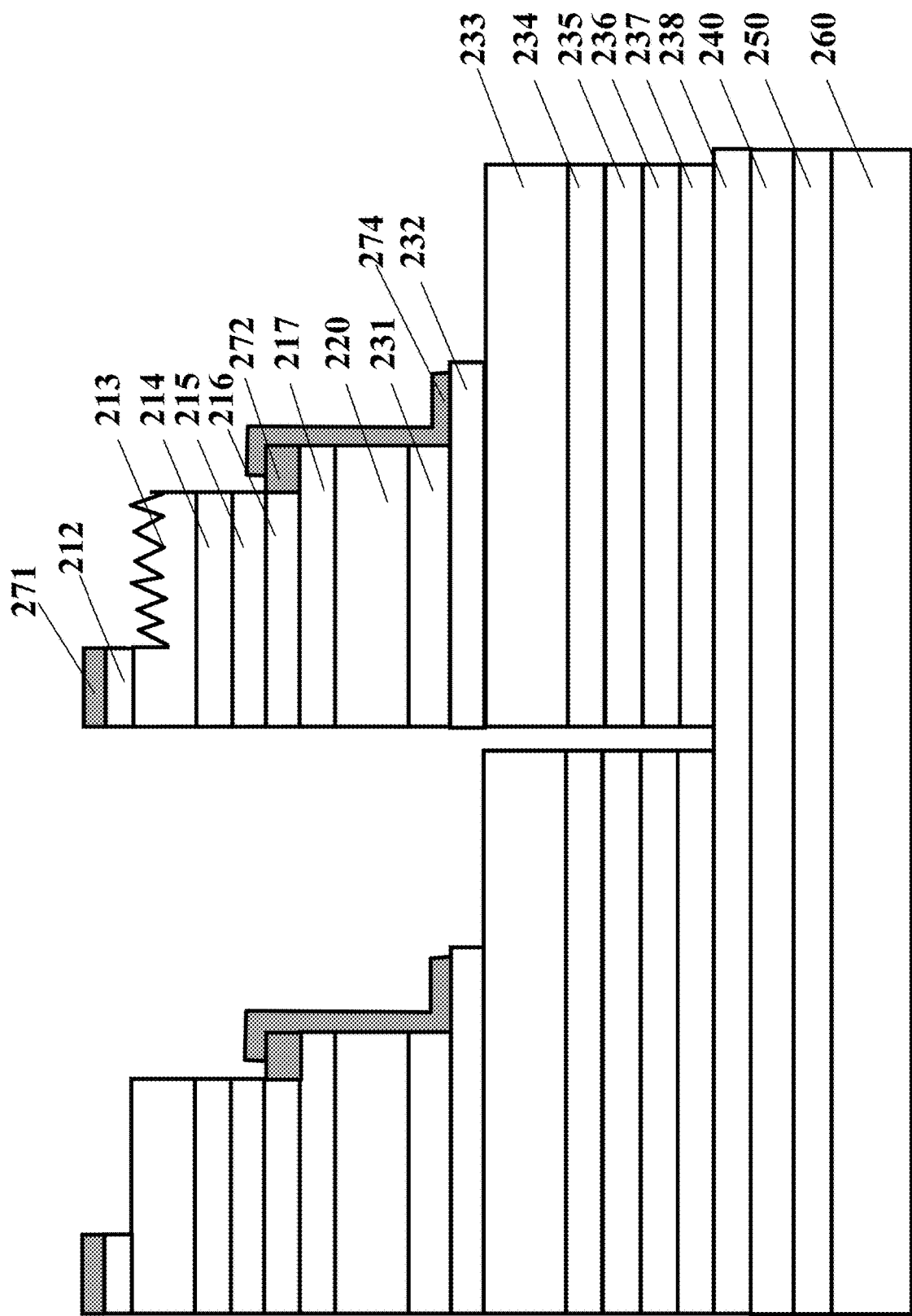
FIG. 12 illustrates a ninth step of fabricating an LED chip for plant lighting according to some embodiments.

Next, singularize the chip and remove part of the second N-type electrode diffusion layer 233, the second N-type covering layer 234, the second light emitting layer 235, the second P-type covering layer 236 and the P-type transition layer 237, till the second P-type ohmic contact layer 238 for patterning, as shown in FIG. 12.

Figure 13:
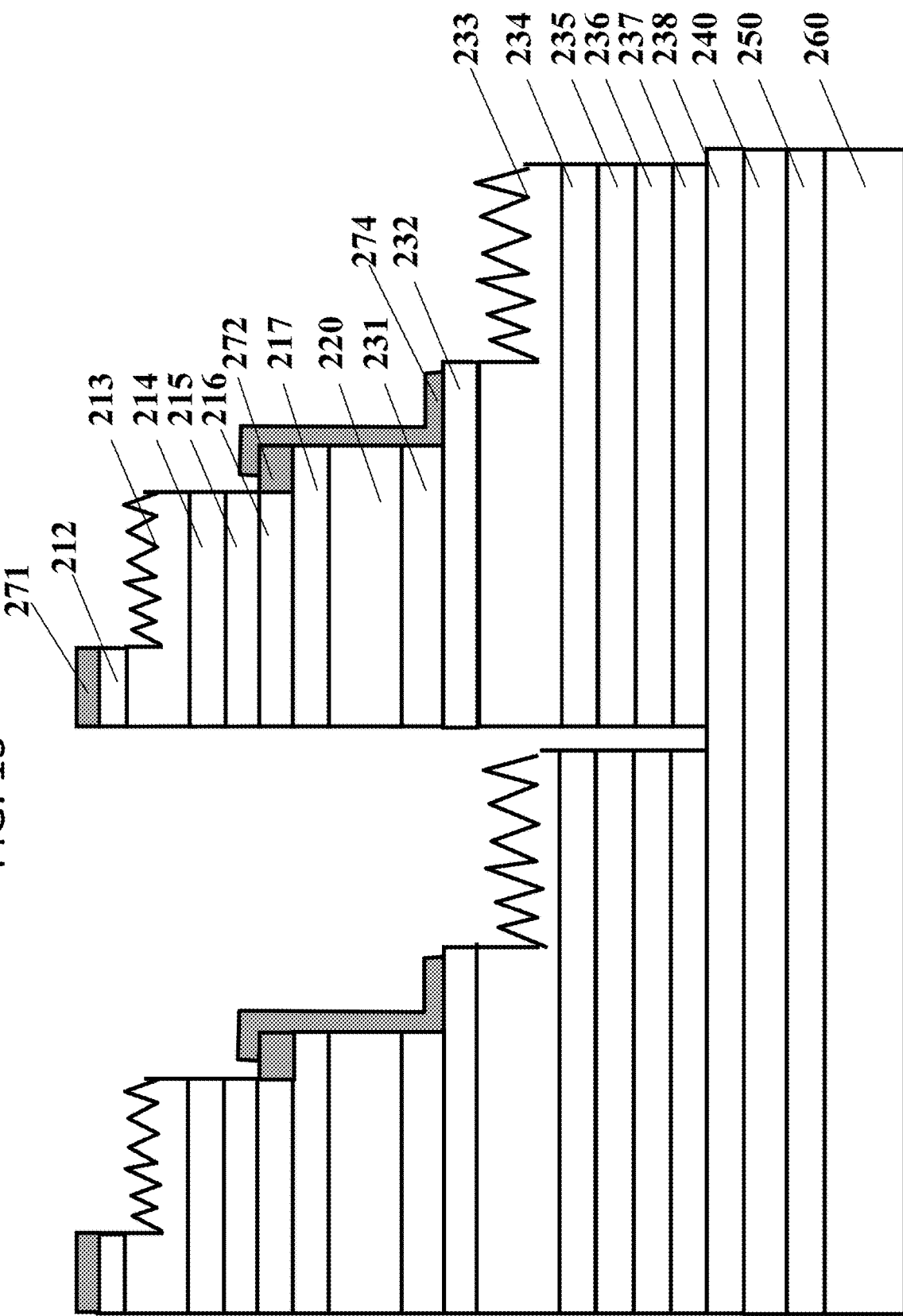
FIG. 13 illustrates a tenth step of fabricating an LED chip for plant lighting according to some embodiments.

In some embodiments, form a light-intensifying structure on surfaces of the first N-type electrode diffusion layer 213 and the second N-type electrode diffusion layer 233 with hydrochloride acid solution, as shown in FIG. 13.

Last, form a P-type electrode 275 on back of the conductive substrate 260 to complete a vertical LED chip for plant lighting.

With a combination of epitaxial growth of ultra-red-light and far-red-light laminated layer and chip fabrication, this embodiment reduces number of packages and area of plant lighting plate, and therefore cut cost.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED) for plant lighting, comprising:
a first red-light epitaxial laminated layer having a first light-emitting layer; and a second red-light epitaxial laminated layer having a second light-emitting layer; wherein:
a light-emitting area of the first red-light epitaxial laminated layer is less than a light-emitting area of the second red-light epitaxial laminated layer; and
a light emitting wavelength of the first light-emitting layer is longer than a light emitting wavelength of the second light-emitting layer.

2. The LED of claim 1, further comprising a distributed Bragg reflector (DBR) semiconductor laminated layer between the first red-light epitaxial laminated layer and the second red-light epitaxial laminated layer.

3. The LED of claim 2, wherein the DBR semiconductor laminated layer is smaller than the light-emitting area of the second red-light epitaxial laminated layer, but larger than the light-emitting area of the first red-light epitaxial laminated layer.

4. The LED of claim 2, wherein:
a surface of the second red-light epitaxial laminated layer is preset with a light-emitting area and a non-light-emitting area;
the DBR semiconductor laminated layer is formed on the non-light-emitting zone of the second red-light epitaxial laminated layer; and
the first red-light epitaxial laminated layer is formed on the DBR semiconductor laminated layer.

5. The LED of claim 4, wherein a doping concentration of the DBR semiconductor laminated layer is $5 \times 10^{17}$ to thereby form a high-resistance interface.

6. The LED of claim 4, wherein the DBR semiconductor laminated layer form a high-resistance interface, when injecting a current to the LED, the DBR semiconductor laminated layer prevents the current from entering into the non-light-emitting area of the second red-light epitaxial laminated layer, but flows as far as possible to the light-emitting area of the second red-light epitaxial laminated layer.

7. The LED of claim 6, further comprising an electrical coupling structure which electrically connects to the first red-light epitaxial laminated layer and the second red-light epitaxial laminated layer.

8. The LED of claim 7, wherein:
the first red-light epitaxial laminated layer further includes a first N-type semiconductor layer and a first P-type semiconductor layer;
the second red-light epitaxial laminated layer further includes a second N-type semiconductor layer and a second P-type semiconductor layer; and
the first P-type semiconductor layer electrically connects to the second N-type semiconductor layer via the electrical coupling structure.

9. The LED of claim 8, further comprising an electrical current diffusion structure disposed over a non-light-emitting area of the second N-type semiconductor layer.

10. The LED of claim 1, further comprising a high-resistance semiconductor layer between the first red-light epitaxial laminated layer and the second red-light epitaxial laminated layer, and wherein:
a surface of the second red-light epitaxial laminated layer is preset with a light-emitting area and a non-light-emitting area;
the high-resistance semiconductor layer is formed on the non-light-emitting zone of the second red-light epitaxial laminated layer; and
the first red-light epitaxial laminated layer is formed on the high-resistance semiconductor layer.

11. The LED of claim 10, when injecting a current to the LED, the high-resistance semiconductor layer prevents the current from entering into the non-light-emitting area of the second red-light epitaxial laminated layer, but flows as far as possible to the light-emitting area of the second red-light epitaxial laminated layer.

12. The LED of claim 11, further comprising an electrical coupling structure which electrically connects to the first red-light epitaxial laminated layer and the second red-light epitaxial laminated layer.

13. The LED of claim 12, wherein:
the first red-light epitaxial laminated layer further includes a first N-type semiconductor layer and a first P-type semiconductor layer;
the second red-light epitaxial laminated layer further includes a second N-type semiconductor layer and a second P-type semiconductor layer; and
the first P-type semiconductor layer electrically connects to the second N-type semiconductor layer via the electrical coupling structure.

14. The LED of claim 13, further comprising an electrical current diffusion structure disposed over a non-light-emitting area of the second N-type semiconductor layer.

15. The LED of claim 1, wherein a light emitting wavelength of the first light-emitting layer is 710 nm-750 nm, and a light emitting wavelength of the second light-emitting layer is 640 nm-680 nm.

16. The LED of claim 15, wherein the light emitting wavelength of the first light-emitting layer is 730 nm, and the light emitting wavelength of the second light-emitting layer is 660 nm.

17. The LED of claim 1, wherein the light-emitting area of the first red-light epitaxial laminated layer is one-third of the light-emitting area of the second red-light epitaxial laminated layer.

18. A fabrication method of a plant lighting light-emitting diode (LED), the method comprising:
providing a LED epitaxial wafer, which comprising: a first red-light epitaxial laminated layer includes a first light-emitting layer, and a second red-light epitaxial laminated layer includes a second light-emitting layer, wherein a light emitting wavelength of the first light-emitting layer is longer than a light emitting wavelength of the second light-emitting layer;
defining a first light-emitting zone and a second light-emitting zone on the epitaxial wafer surface; and
removing the red-light epitaxial laminated layer of the second light-emitting area to forming a first light-emitting area for the first red-light epitaxial laminated layer and a second light-emitting area for the second red-light epitaxial laminated layer;
where the first light-emitting area is less than the second light-emitting area.

19. The method of claim 18, wherein the epitaxial wafer further comprising a DBR semiconductor laminated layer between the first red-light epitaxial laminated layer and the second red-light epitaxial laminated layer, and also removing the DBR semiconductor laminated layer of the second light-emitting area.

20. The method of claim 19, further comprising:
forming an electrical coupling structure which electrically connects to the first red-light epitaxial laminated layer and the second red-light epitaxial laminated layer.

* * * * *